(12) United States Patent
Kim et al.

(10) Patent No.: US 9,841,462 B2
(45) Date of Patent: Dec. 12, 2017

(54) ELECTRONIC APPARATUS, INPUT APPARATUS FOR DISPLAY APPARATUS, AND METHOD OF DETECTING REMAINING UTILITY OF BATTERY OF THE SAME

(71) Applicant: SAMSUNG ELECTRONICS CO., LTD., Suwon-si (KR)

(72) Inventors: Sang-jin Kim, Suwon-si (KR); Kun-ho Keum, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 231 days.

(21) Appl. No.: 14/333,562

(22) Filed: Jul. 17, 2014

(65) Prior Publication Data

US 2015/0115971 A1    Apr. 30, 2015

(30) Foreign Application Priority Data

Oct. 24, 2013    (KR) .................. 10-2013-0127087

(51) Int. Cl.
    *G01R 31/36*    (2006.01)
    *G06F 1/30*    (2006.01)
    (Continued)

(52) U.S. Cl.
    CPC ....... *G01R 31/362* (2013.01); *G01R 31/3682* (2013.01); *G06F 1/305* (2013.01);
    (Continued)

(58) Field of Classification Search
    CPC .................................................. G01R 31/362
    (Continued)

(56) References Cited

U.S. PATENT DOCUMENTS 5,345,392 A  * 9/1994 Mito .................. G01R 31/3624
                                                324/431
5,473,262 A   12/1995 Yoshimatsu
            (Continued)

FOREIGN PATENT DOCUMENTS

DE    10 2009 028 911 A1    3/2011

OTHER PUBLICATIONS

Communication dated Mar. 19, 2015 issued by the European Patent Office in counterpart European Patent Application No. 14172339.5.

*Primary Examiner* — Drew A Dunn
*Assistant Examiner* — Jerry D Robbins
(74) *Attorney, Agent, or Firm* — Sughrue Mion, PLLC

(57) ABSTRACT

An electronic apparatus, an input apparatus and a method of determining a remaining utility of a battery of the same, the electronic apparatus including: a battery configured to supply power to the electronic apparatus; a first detector configured to receive a voltage value of the battery, to convert the voltage value into a signal, and to output the signal; a second detector configured to detect a decrease in the voltage value of the battery to a reference voltage or lower and to output a detection result; and a controller configured to receive the output values of the first and second detectors, to determine a remaining utility of the battery based on the output values of the first and second detectors, and to determine an abnormal state of the battery based on the output values of the first and second detectors.

19 Claims, 7 Drawing Sheets

(51) Int. Cl.
*G06F 1/32* (2006.01)
*G01R 19/165* (2006.01)

(52) U.S. Cl.
CPC .......... *G06F 1/3212* (2013.01); *G06F 1/3296* (2013.01); *G01R 19/16542* (2013.01); *G01R 31/3693* (2013.01); *Y02B 60/1285* (2013.01); *Y02B 60/1292* (2013.01)

(58) Field of Classification Search
USPC ........................................................ 324/435
See application file for complete search history.

(56) References Cited

U.S. PATENT DOCUMENTS

| | | | | |
|---|---|---|---|---|
| 5,497,507 | A * | 3/1996 | Komaki | H04W 88/06 455/552.1 |
| 6,405,062 | B1 * | 6/2002 | Izaki | G01R 31/362 320/132 |
| 7,235,949 | B2 * | 6/2007 | Ikeda | G01R 31/3648 320/132 |
| 8,125,186 | B2 * | 2/2012 | Carkner | H02J 7/0047 320/132 |
| 8,324,861 | B2 | 12/2012 | Huo et al. | |
| 8,325,983 | B2 * | 12/2012 | Ren | G06K 9/4614 382/103 |
| 2005/0231167 | A1 * | 10/2005 | Kubota | G01R 31/3648 320/132 |
| 2007/0121536 | A1 * | 5/2007 | Aihara | H04W 48/18 370/318 |
| 2007/0145949 | A1 * | 6/2007 | Matsushima | H02J 7/00 320/132 |

\* cited by examiner

ELECTRONIC APPARATUS, INPUT APPARATUS FOR DISPLAY APPARATUS, AND METHOD OF DETECTING REMAINING UTILITY OF BATTERY OF THE SAME

CROSS-REFERENCE TO RELATED APPLICATION

This application claims priority from Korean Patent Application No. 10-2013-0127087, filed on Oct. 24, 2013 in the Korean Intellectual Property Office, the disclosure of which is incorporated herein by reference in its entirety.

BACKGROUND

Field

Apparatuses and methods consistent with one or more exemplary embodiments relate to an electronic apparatus, an input apparatus and a method of determining a remaining utility of a battery, such as a charge, of the same, more particularly to an electronic apparatus using a battery as driving power and determining a remaining utility of the battery, an input apparatus and a method of determining a remaining utility of a battery of the same.

Description of the Related Art

Generally, electronic apparatuses using a disposable battery have a function of detecting a remaining quantity or remaining utility of the battery and notifying users of the remaining amount. For example, a TV remote controller displays a remaining utility of a battery of the remote controller on a display of the remote controller or a display screen of a TV, and users may recognize whether the battery needs replacing.

To this end, a conventional electronic apparatus includes an analog-to-digital (A/D) converter to measure a voltage of a battery and to convert the voltage into a digital signal, displays a remaining utility of the battery using an average voltage determined based on an output from the A/D converter and displays a state of the battery having insufficient remaining utility to lead users to replace the battery.

However, the conventional technology using the average voltage of the A/D converter may not detect a voltage drop that temporarily occurs in the battery. For example, alkaline or manganese disposable batteries may have a temporary voltage drop when having passed the expiration date regardless of whether the batteries are unsealed or due to other defects. In particular, since manganese batteries frequently involve a temporary voltage drop resulting from own problems, it is recommended not to use the batteries but consumers do not always know of or follow the recommendation.

The conventional technology may not properly detect a defect in the battery due to a temporary voltage drop, so that the indication of a time to replace the battery may be missed, thereby causing inconvenience to the users. Moreover, an instruction to replace the battery may be mistaken as an error in an apparatus, and thus time and costs may be consumed in unnecessary services.

SUMMARY

An aspect of one or more exemplary embodiments is to provide an image processing apparatus which is capable of reversely displaying an image for user convenience while maintaining readability of additional information displayed along with the image and a control method thereof.

The foregoing and/or other aspects may be achieved by providing an electronic apparatus including: a battery configured to supply driving power to the electronic apparatus; a first detector configured to receive a voltage value of the battery, to convert the voltage value into a signal and to output the signal; a second detector configured to detect a decrease in the voltage of the battery to a reference voltage value or lower and to output a detection result; and a controller configured to receive the output values of the first and second detectors, to determine a remaining utility of the battery based on the output values of the first and second detectors, and to determine an abnormal state of the battery based on the output values of the first and second detectors.

The reference voltage value may be a predetermined reference voltage value.

The electronic apparatus may further includes a display, wherein the controller is further configured to control the display to display a user interface (UI) representing the determined remaining utility of the battery.

The controller may control the display to display a UI representing a battery warning in response to the battery being determined to be in an abnormal state.

The controller may determine the remaining utility of the battery as one of a plurality of levels divided according to preset voltage values.

The controller may determine the remaining utility of the battery as a lower level than a level corresponding to an output signal of the first detector based on the detection result of the second detector.

The electronic apparatus may further include a communicator configured to transmit information on the remaining utility of the battery to an external device.

The first detector may include an analog-to-digital (A/D) converter configured to convert the voltage value of the battery into a digital value.

The controller may measure the voltage of the battery in a low driving electric current of the electronic apparatus, control the A/D converter to convert the measured voltage into a digital value and to output the value, and calculate an average of output values of the A/D converter.

The second detector may include a plurality of voltage detection blocks having different set reference voltages.

According to an aspect of another exemplary embodiment, a method of determining a remaining utility of a battery of an electronic apparatus including the battery supplying driving power is provided, the method including: converting a voltage value of the battery into a signal; detecting a decrease in voltage of the battery to a reference voltage or lower and outputting a detection result; determining a remaining utility of the battery based on the signal and the detection result; and determining an abnormal state of the battery based on the signal and the detection result.

The reference voltage value may be a predetermined reference voltage value.

The method may further include displaying a user interface (UI) representing the determined remaining utility of the battery.

The method may further include displaying a UI representing a battery warning in response to the battery being determined to be in an abnormal state.

The determining of the remaining utility of the battery may include determining the remaining utility of the battery to be one of a plurality of levels divided according to preset voltage values.

The determining of the remaining utility of the battery may include determining the remaining utility of the battery as a lower level than a level corresponding to the signal based on the detection result.

The method may further include transmitting information on the remaining utility of the battery to an external device.

The outputting of the first output value may include converting the voltage value of the battery into a digital value and outputting the digital value.

The converting may include outputting a plurality of digital values, and the method may further include calculating an average of the plurality of digital values.

According to an aspect of another exemplary embodiment, an input apparatus of a display apparatus is provided, the input apparatus including: a communicator configured to communicate with the display apparatus; a battery configured to supply power to the input apparatus; a first detector configured to receive a voltage value of the battery, to convert the voltage value into a signal and to output the signal; a second detector configured to detect a decrease in voltage of the battery to a reference voltage or lower and to output a detection result; and a controller configured to receive output values of the first and second detectors, to determine a remaining utility of the battery based on the output values of the first and second detectors, and to determine an abnormal state of the battery based on the output values of the first and second detectors.

The communicator may transmit information on the remaining utility of the battery to the display apparatus, and the display apparatus may display the remaining utility of the battery based on the received information as one of a plurality of levels divided according to preset voltage values and further display a user interface (UI) representing a battery warning in response to the battery being in an abnormal state.

According to an aspect of another exemplary embodiment, an electronic apparatus including a first detector configured to convert a voltage value of a battery into a signal; a second detector configured to detect a state where the voltage value of the battery is lower than a reference voltage value; and a controller configured to determine a remaining utility of the battery based on the signal and detection of the first and second detectors, and to determine an abnormal state of the battery based on the signal and detection of the first and second detectors.

The controller may be configured to control the first detector to detect a plurality of voltage values of the battery over a period of time, to control the first detector to convert the plurality of voltage values into digital values, and to average the plurality of voltage values.

The controller may be configured to determine an abnormal state of the battery in response to the signal corresponding to a high voltage value while the second detector detects the state where the voltage value of the battery is lower than the reference voltage value.

According to an aspect of another exemplary embodiment, a method of determining a remaining utility of a battery is provided, the method including converting a voltage value of the battery into a signal; detecting a state where the voltage value of the battery is lower than a reference voltage value; determining a remaining utility of the battery based on the signal and a result of the detecting; and determining an abnormal state of the battery based on the signal and the result of the detecting.

As described above, one or more exemplary embodiments may reversely display an image to enhance user convenience while maintaining readability of additional information displayed along with the image.

BRIEF DESCRIPTION OF THE DRAWINGS

The above and/or other aspects will become apparent and more readily appreciated from the following description of one or more exemplary embodiments, taken in conjunction with the accompanying drawings, in which.

DETAILED DESCRIPTION OF EXEMPLARY EMBODIMENTS

Below, exemplary embodiments will be described in detail with reference to the accompanying drawings.

Figure 1:
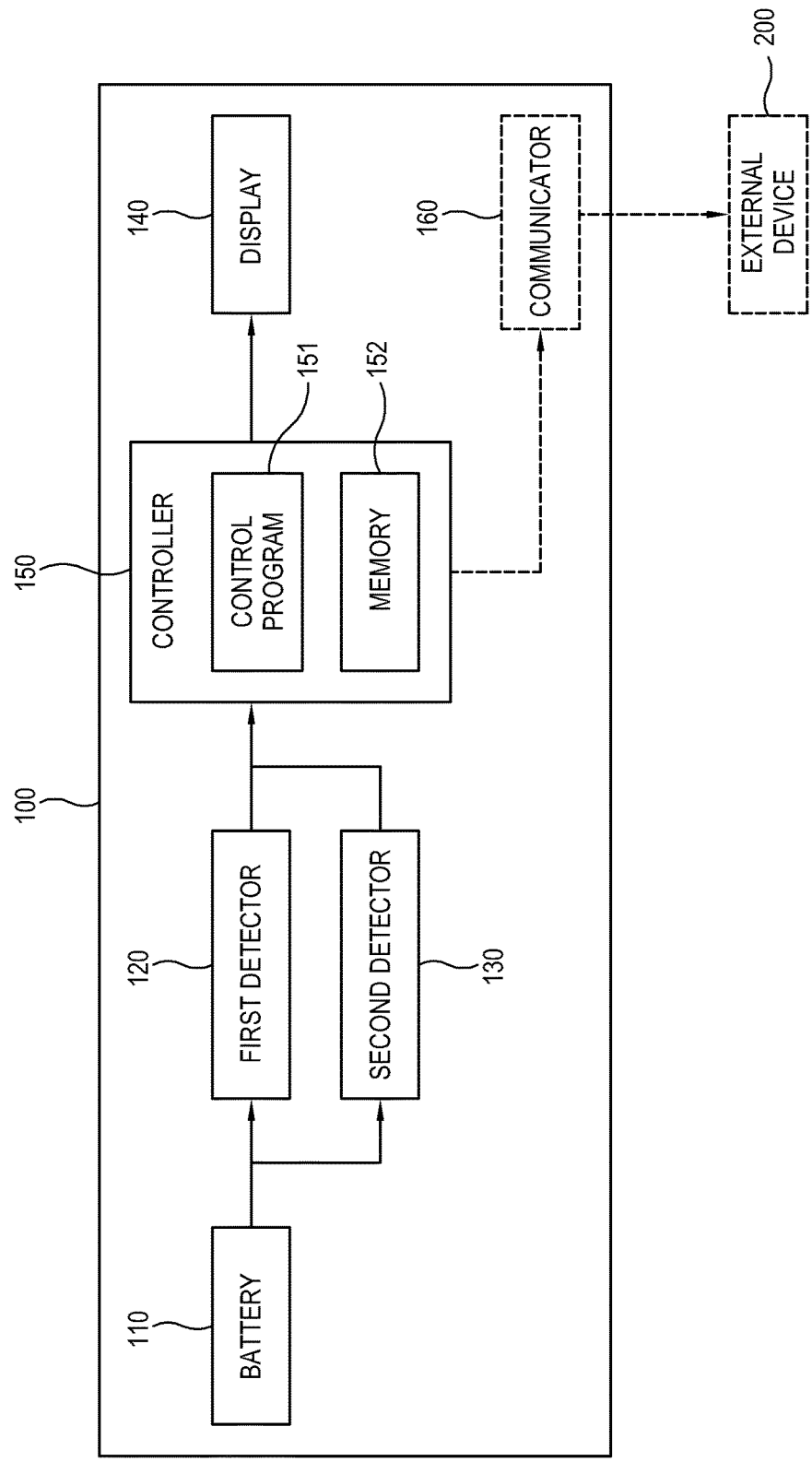
FIG. 1 is a block diagram illustrating a configuration of an electronic apparatus according to an exemplary embodiment.

FIG. 1 is a block diagram illustrating a configuration of an electronic apparatus 100 according to an exemplary embodiment.

The electronic apparatus 100 is supplied with driving power from a battery and may be configured as an input apparatus, for example, a TV remote controller, of a display system including a display apparatus 200 (FIG. 6) such as, as a non-limiting example, a TV. The display apparatus processes an image signal according to a preset process to display an image, while the input apparatus generates a preset command, data, information or signal to remotely control the display apparatus and transmits the command, data, information or signal to the display apparatus.

The display apparatus may display broadcast images based on broadcast signals, broadcast information or broadcast data received from a transmitter of a broadcasting station. In addition, the display apparatus may also display other kinds of image, without limiting to broadcast images, for example, videos, still images based on signals or data received from various types of image sources (not shown), applications, on-screen displays (OSDs) and user interfaces (UIs, also referred to as "graphic user interfaces (GUIs)") for controlling various operations. Here, UIs displayed on the display apparatus may include an icon representing a remaining utility of the battery of the input apparatus and an icon indicating a shortage of utility of the battery of the input apparatus. As non-limiting examples, the utility of a battery may be a charge or an ability to maintain a certain power output.

One or more exemplary embodiments may be also applied to a different display system, for example, a system in which a monitor connected to a computer main body is provided as a display apparatus and an input apparatus communicates with the computer main body. That is, for illustrative purposes only, one or more exemplary embodiments may be changed and modified variously depending on configurations of systems. However, this is just an example, and the electronic apparatus 100 may be an input apparatus for a non-display apparatus.

The input apparatus is an external device capable of conducting wireless communications with the display apparatus, wherein the wireless communications may include infrared communications and radio frequency (RF) communications. The input apparatus may be manipulated by a user to transmit a preset command to the display apparatus.

However, the electronic apparatus 100 is not limited to the input apparatus but may include a variety of devices capable of notifying users of battery information including, as non-limiting examples, diverse terminal devices using batteries as driving power, for example, mobile devices such as MP3 players, Bluetooth headsets, smartphones and tablet PCs, and cordless phones.

As shown in FIG. 1, the electronic apparatus 100 includes a battery 110 to supply driving power, a first detector 120 to receive a voltage value of the battery 110, to convert the voltage value into a signal (digital signal) to be perceived by a controller 150 and to output the signal, a second detector 130 to detect a decrease in voltage of the battery 110 to a reference voltage or lower and to output a detection result to the controller 150, a display 140 to display a remaining utility of the battery, and the controller 150 to control overall operations of the electronic apparatus 100. The electronic apparatus 100 according to the present embodiment may further include a communicator 160 to conduct wire-based or wireless communications with an outside of the electronic apparatus 100.

The battery 110 is, for example, a generally used battery, that is, a disposable battery, but may be provided as a rechargeable battery.

The first detector 120 is provided as an analog-to-digital (A/D) converter (ADC block) to convert an input analog value into a digital value, and performs an operation of converting an input voltage value of the battery into a digital value so that the voltage value is represented as a level. The first detector 120 may be embedded in the controller 150.

The first detector 120 may receive a voltage value of the battery 110 on a preset cycle according to control by the controller, convert the voltage value into a digital value and outputs the digital value to the controller 150. The output voltage value is stored and updated in the controller 150. The controller 150 may calculate and store an average of stored voltage values.

The second detector 130 detects a decrease in the voltage of the battery 110 to the reference voltage or lower. The second detector 130 may be provided as an integrated circuit (IC, voltage detection block) including a voltage sensing circuit in which a preset voltage is set as a reference voltage. The reference voltage may be a preset reference voltage.

The second detector 130 outputs a high in a normal state, and outputs a low when the voltage of the battery 110 decreases to the reference voltage or lower. Accordingly, an abnormal voltage drop of the battery 110 may be detected. Although a low is output at the reference voltage or lower, this is a non-limiting example. Alternatively, a low may be output in the normal state, while a high may be output when the reference voltage or lower is detected.

A voltage value output by the first detector 120 is defined as a first output value, while a voltage value output by the second detector 130 is defined as a second output value.

The display 140 displays a UI representing the remaining utility of the battery determined on a detection result of the first and second detectors 120 and 130 according to control by the controller 150. When the remaining utility of the battery is abnormal, that is, insufficient, the display 140 may display a UI representing a battery warning. Here, the UI may include a battery-shaped icon 20 (FIG. 6) and display the remaining utility of the battery in a corresponding level of a plurality of preset levels. The plurality of levels will be described in detail with reference to FIG. 3. The UI may further include a text instructing the user to change the battery.

The display 140 may be configured as a flat panel display (FPD) in various display modes using, for example, liquid crystals, plasma, light emitting diodes (LEDs), organic light emitting diodes (OLEDs), a surface conduction electron emitter, a carbon nano-tube, nano-crystals, or the like.

Although FIG. 1 illustrates that battery information is presented on the UI of the display 140, the battery information may be indicated using a different indicator, such as a light emitting diode (LED), either alternatively or additionally, depending on circumstances.

The display 140 may be also provided in a communicable external device 200, not in the electronic apparatus 100. For example, when the electronic device 100 is a remote controller, the UI representing the battery information may be displayed on a display of the external device 200 such as a TV. In this case, an audio signal is transmitted through the communicator 160 to the external device 200 capable of outputting an audio, and the external device 200 may indicate the remaining utility of the battery and whether to change the battery.

Further, audio guidance on the battery information may be provided through an audio output unit (not shown), such as a speaker.

The controller 150 determines the remaining utility of the battery (also referred to as "the remaining quantity of the battery" or "the amount of the battery left") based on output values from the first and second detectors 120 and 130. In detail, the controller 150 receives the output values from the first and second detectors 120 and 130 and determines, based on a decrease of the output value of the second detector 130 and from the output value of the first detector 120, whether the remaining utility of the battery is normal or abnormal. The controller 150 may be configured as a micro control unit (MCU) or an application processor (AP) and may internally include a control program storage area 151 and a memory 152 to store needed data.

Figure 2:
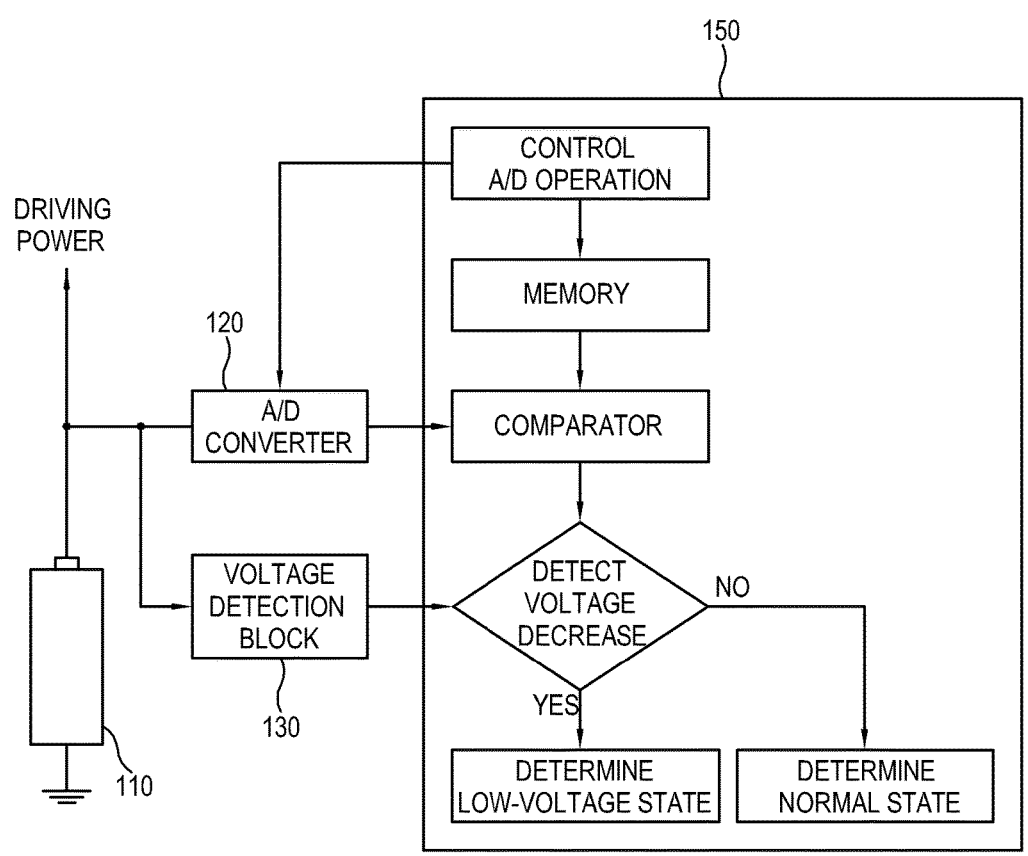
FIGS. 2 and 3 illustrate operations of components of the electronic apparatus of FIG. 1.
Figure 3:
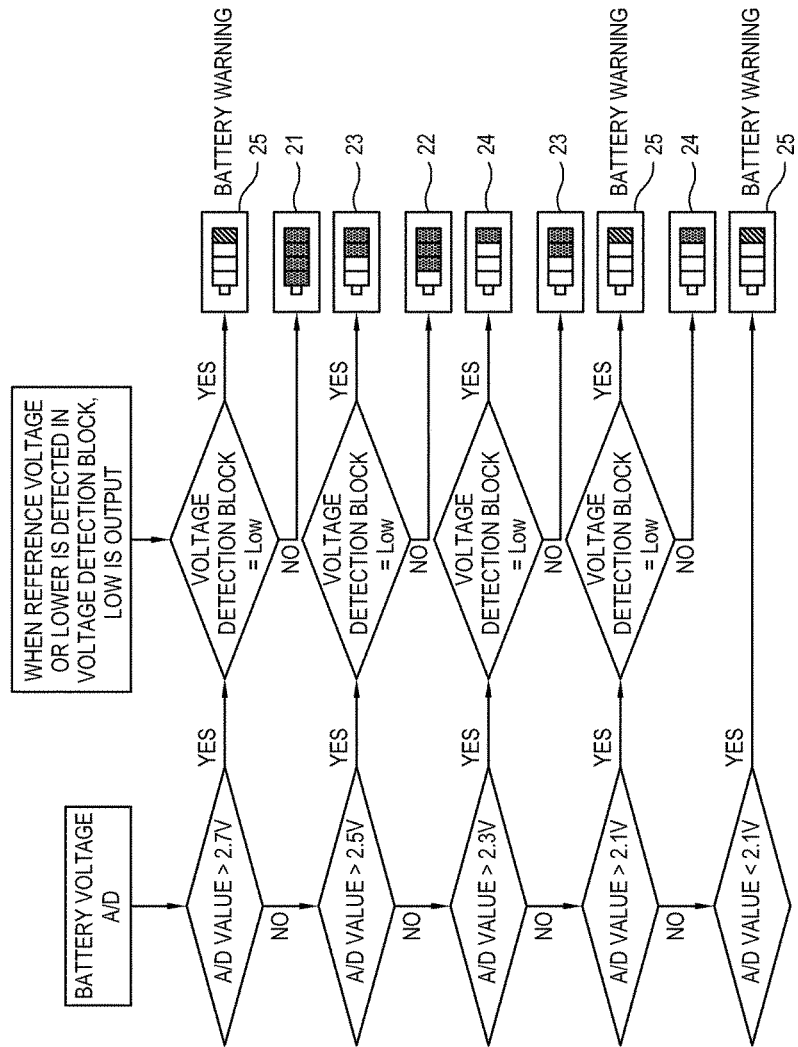

FIGS. 2 and 3 illustrate operations of components of the electronic apparatus 100 of FIG. 1.

As shown in FIG. 2, the controller 150 controls A/D operations of the first detector, that is, the A/D converter 120, to read the voltage value of the battery 110 on the preset cycle and to convert the voltage value into a digital value. The controller 150 compares the read voltage value of the battery 110 with the plurality of levels stored in the memory 152.

For example, in a remote controller using two 1.5-V batteries connected in series, the plurality of levels may include five levels, that is, first to fifth levels, based on 2.7 V, 2.5 V, 2.3 V and 2.1 V, as shown in FIG. 3. Here, a first level is a level corresponding to a maximum remaining utility of the battery, and a fifth level is a level corresponding to an abnormal state that the battery needs replacing, that is, a battery warning. Alternatively, the plurality of battery levels may be divided in various ways in addition to the example shown in FIG. 3. Further, FIG. 3 is only an example, and, as a non-limiting example, an abnormal state of the battery may be shown whenever there is a decrease of the output value of the second detector 130.

The controller 150 compares an output value from the A/D converter 120 with a level in the memory 152 as shown in FIG. 2. Here, the controller 150 according to the present embodiment may include a circuit including a plurality of comparators to conduct comparison operations by each level or be programmed to conduct comparison operations by each level in a software manner.

The controller 150 may control the A/D converter 120 to measure a voltage of the battery in a low driving current state of the electronic apparatus 100, to convert the measured voltage into a digital value, and to output the digital value. Here, in the low driving current state, the electronic apparatus 100 is not manipulated by the user and does not functionally operate. That is, when the user manipulates the electronic apparatus 100 and/or the electronic apparatus 100 functionally operates, consumption of an electric current varies substantially, resulting in a considerable change in voltage of the battery, and thus the A/D operation is preferably performed in the low driving current state.

Also, the controller 150 may control the A/D converter 120 to measure the voltage of the battery on a preset detection cycle, to convert the measured voltage into a digital value, and to output the digital value. In detail, when the detection cycle begins, the controller 150 may determine whether a user manipulation is input to the electronic apparatus 100 or whether a function of the electronic apparatus 100 is performed, and control the A/D converter 120 to measure the voltage if it is determined that no user manipulation is input and no function is performed.

The controller 150 may control the A/D converter 120 to detect the voltage of the battery a preset number of times, for example, five times, over a minute sampling cycle and calculate an average of detected voltages of the battery.

The controller 150 determines whether a low is received from the second detector, that is, the voltage detection block 130, as shown in FIG. 2. Here, the voltage detection block 130 outputs a high in the normal state, and outputs a low when the voltage of the battery 110 is detected to decrease to the preset reference voltage or lower. In a remote controller using two 1.5-V batteries connected in series, the reference voltage may be set to, for example, 2 V. The reference voltage of the voltage detection block 130 may be changed based on an operating current of the apparatus or an operable voltage of an internal circuit.

Referring to FIG. 2, when the voltage detection block 130 detects a voltage drop to the reference voltage or lower and thus outputs a low, the controller 150 determines the battery 110 is a low-voltage state, that is, an abnormal state that the battery 110 needs replacing. When the voltage detection block 130 outputs a high, the controller 150 determines that the battery 110 is in the normal state.

In a remote controller using two 1.5-V batteries connected in series, as shown in FIG. 3, when the first detector 120 outputs a voltage of higher than 2.7 V and the second detector 130 outputs a high, the controller 150 determines the battery 110 to be in the first level and controls the display 140 to display the icon 21 representing a corresponding remaining utility of the battery as a UI. Here, when the first detector 120 outputs a voltage of higher than 2.7 V but the second detector 130 outputs a low, the controller 150 determines the battery 110 to be in the fifth level and controls the display 140 to display a corresponding icon 25. Here, the display 140 may display a text corresponding to a battery warning along with the icon 25.

Thus, when a decrease of an output value of the second detector 130 from an output value of the first detector 120 is excessively large, the controller 150 determines that the remaining utility of the battery is abnormal, that is, the battery 110 needs replacing.

A disposable battery has an expiration date regardless of whether the battery is unsealed and used. When the expiration date of the battery draws near, a temporary high voltage drop may be detected in the second detector 130 even though the first detector 120 has a high average voltage of 2.7 V or higher. Thus, the electronic apparatus 100 detects even a defect or abnormality in the battery due to such a temporary high voltage drop, which is difficult to detect by a conventional A/D converter, leading the user to replace the battery, thereby improving user's inconvenience.

Figure 4:
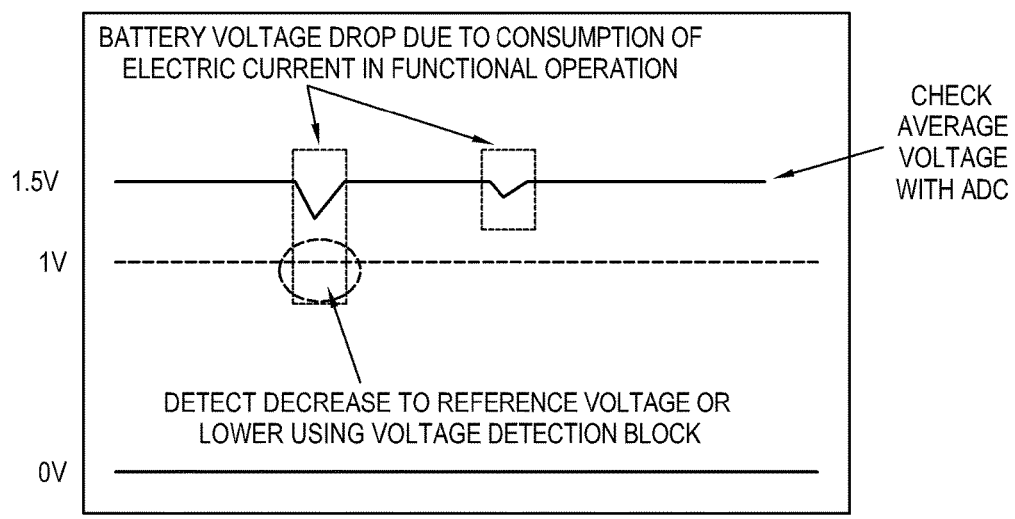
FIGS. 4 and 5 are graphs illustrating voltages output from a normal battery and an abnormal battery according to an exemplary embodiment.
Figure 5:
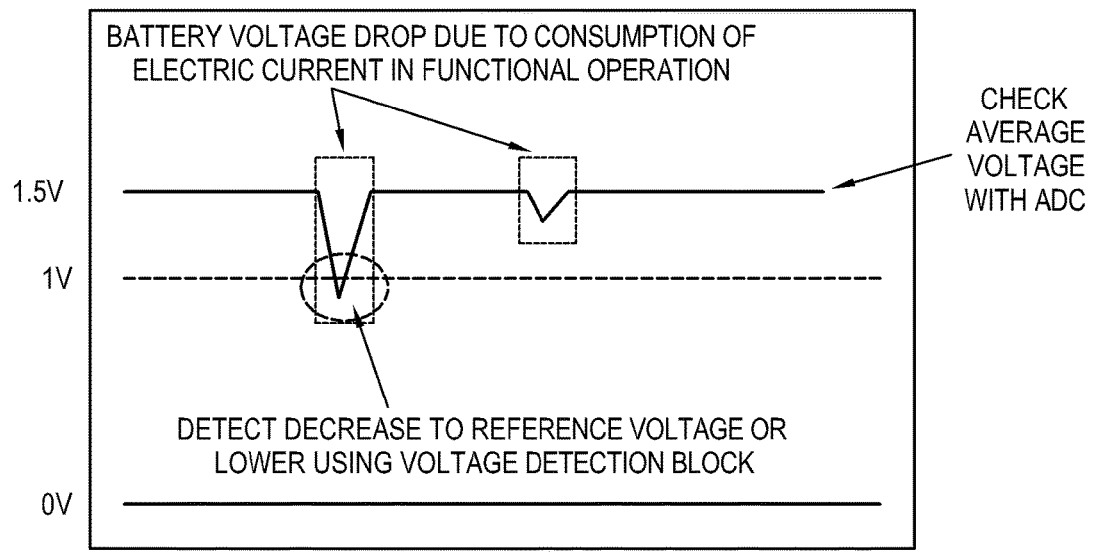

FIGS. 4 and 5 are graphs illustrating voltages output from a normal battery and an abnormal battery according to an exemplary embodiment. Here, FIGS. 4 and 5 each illustrate a voltage output from one 1.5-V battery, in which the second detector 130 has a reference voltage set to 1 V.

As shown in FIG. 4, in the normal battery, an average voltage detected by the first detector 120 is maintained at about 1.5 V and a voltage slightly drops depending on consumption of an electric current when the electronic apparatus 100 functionally operates. In the normal state, since a voltage drop to the reference voltage of 1 V or lower does not happen, the second detector 130 continues to output a high.

As shown in FIG. 5, however in an abnormal battery, such as an expired battery, while maintaining an average voltage of about 1.5 V, a high voltage drop may occur temporarily when the electronic apparatus 100 functionally operates, and accordingly the voltage of the battery may drop to the reference voltage of 1 V or lower. The second detector 130 detects the voltage drop and outputs a low. The controller 150 determines the battery to be in the fifth level as in FIG. 3 and controls the display 150 to display the corresponding icon 25.

As shown in FIG. 3, when the first detector 120 outputs a voltage of higher than 2.5 V and 2.7 V or lower and the second detector 130 outputs a high, the controller 150 determines the battery 110 to be in a second level and controls the display 140 to display an icon 22 representing a corresponding remaining utility of the battery as a UI. Here, when the first detector 120 outputs a voltage of higher than 2.5 V and 2.7 V or lower but the second detector 130 outputs a low, the controller 150 determines the battery 110 to be in a third level, one level lower than the second level, and controls the display 140 to display a corresponding icon 23.

Similarly, when the first detector 120 outputs a voltage of higher than 2.3 V and 2.5 or lower and the second detector 130 outputs a high, the controller 150 determines the battery 110 to be in the third level and controls the display 140 to display the icon 23 representing a corresponding remaining utility of the battery as a UI. Here, when the first detector 120 outputs a voltage of higher than 2.3 V and 2.5 or lower but the second detector 130 outputs a low, the controller 150 determines the battery 110 to be in a fourth level, one level lower than the third level, and controls the display 140 to display a corresponding icon 24.

Likewise, when the first detector 120 outputs a voltage of higher than 2.1 V and 2.3 or lower and the second detector 130 outputs a high, the controller 150 determines the battery 110 to be in the fourth level and controls the display 140 to display the icon 24 representing a corresponding remaining utility of the battery as a UI. Here, when the first detector 120 outputs a voltage of higher than 2.1 V and 2.3 or lower but the second detector 130 outputs a low, the controller 150 determines the battery 110 to be in the fifth level, one level lower than the fourth level, and controls the display 140 to display the corresponding icon 25.

Further, when the first detector 120 outputs a voltage of 2.1 or lower the controller 150 determines the battery 110 to be in the fifth level regardless of whether the second detector 130 outputs a high or low and controls the display 140 to display the icon 25 representing a corresponding remaining utility of the battery as a UI.

Here, when the battery is determined to be in the fifth level, the controller 150 may control the display 140 to display a text, graphic or color indicating a battery warning along with the icon 25.

The communicator 160 shown in FIG. 1 conducts communication with the external device 200, such as the display apparatus, and has a communication specification corresponding to that of a communicator of the external device 200. For instance, the communicator 160 transmits and receives a control signal using wireless communications, which may include infrared communications, radio frequency (RF), ZigBee and Bluetooth. When the display is not provided in the electronic apparatus 100, the communicator 160 may transmit a command to display the battery information to the external device 200 including a display according to control by the controller 150.

Figure 6:
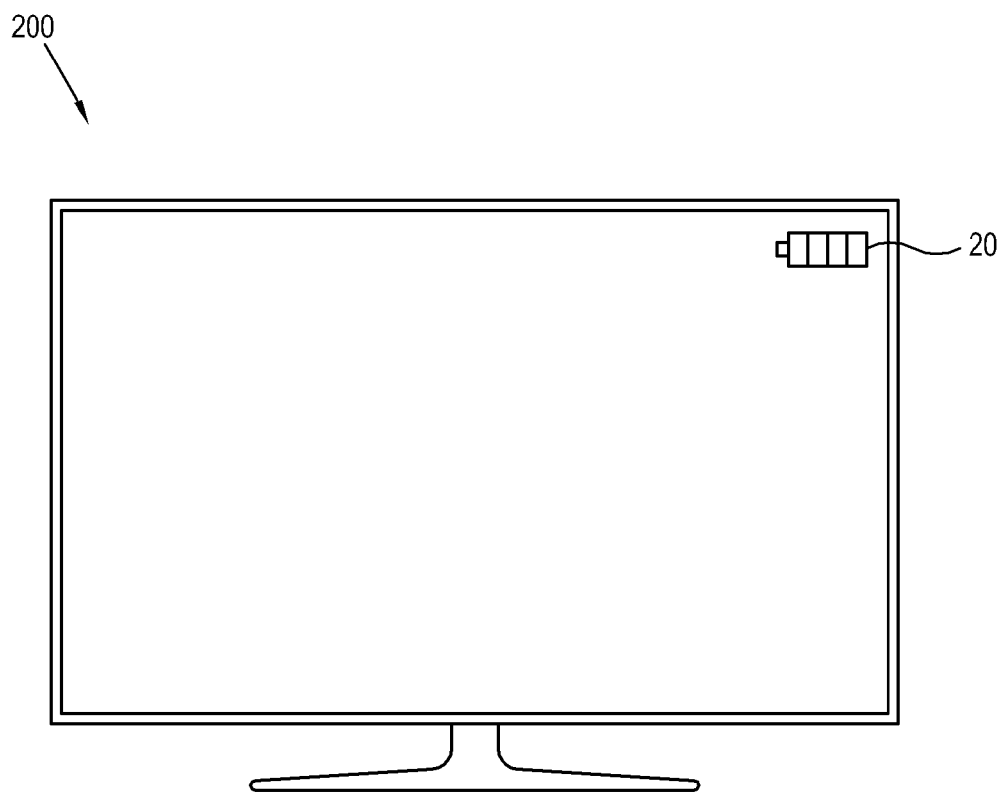
FIG. 6 illustrates that battery information is displayed on an external device according to an exemplary embodiment.

FIG. 6 illustrates that battery information is displayed on the external device 200.

The controller 150 may control the communicator 160 to transmit a command to display battery information determined on a combination of detection results of the first and second detectors 120 and 130 on the external device 200. The external device 200 receives the command and displays a UI 20 representing the remaining utility of the battery as shown in FIG. 6. The UI 20 may include the icons 21 to 25 shown in FIG. 3. When the remaining utility of the battery 110 is determined to be abnormal, that is, the battery 110 is determined to need replacing, the external device 200 may further display a UI, such as a text, graphic or color to indicate a battery warning or a text or icon to indicate replacement of the battery. Here, when the battery 110 is rechargeable and the remaining utility of the battery 110 is abnormal, a UI to indicate that the battery 110 needs charging may be displayed.

Although the second detector 130 is described as a single voltage detection block, a plurality of voltage detection blocks having different reference voltages may be included. When two or more reference voltages are used, a state of the battery may be more accurately identified.

Hereinafter, a method of determining the remaining utility of the battery of the electronic apparatus according to an exemplary embodiment will be described with reference to the drawings.

Figure 7:
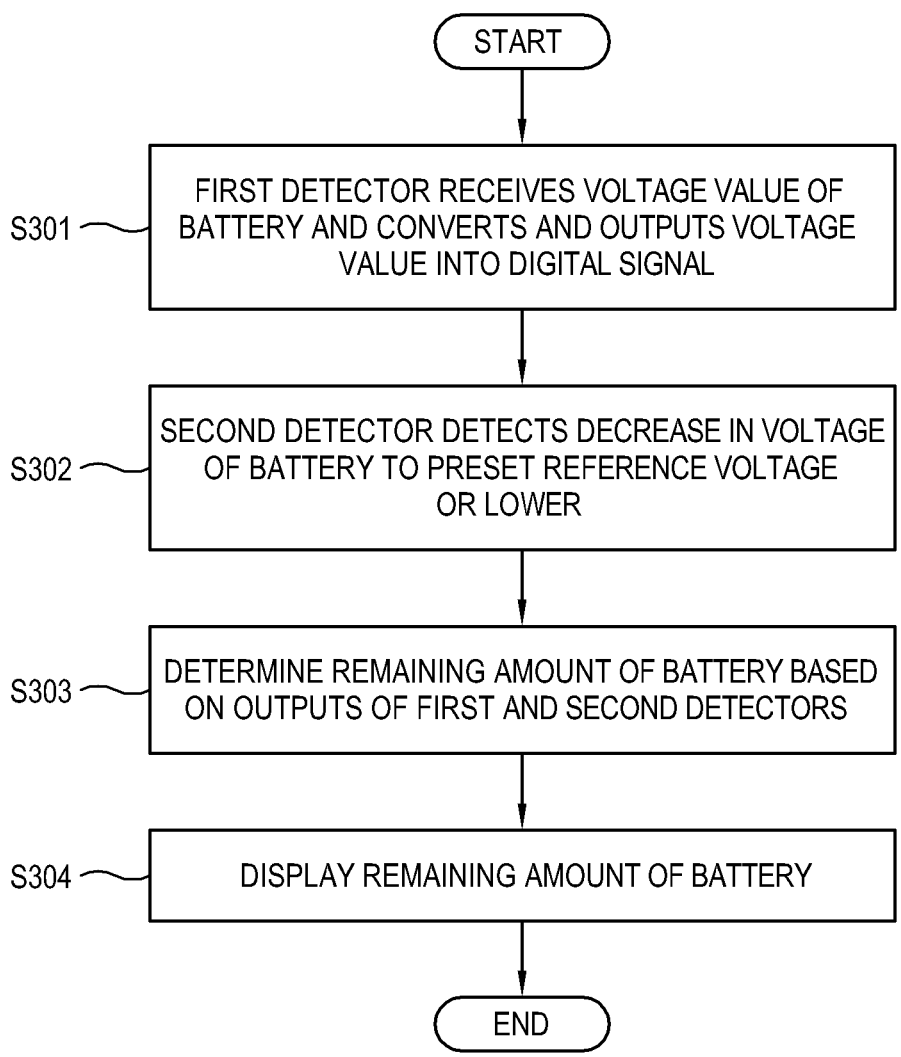
FIG. 7 is a flowchart illustrating a method of determining a remaining utility of a battery of the electronic apparatus according to an exemplary embodiment.

FIG. 7 is a flowchart illustrating the method of determining the remaining utility of the battery of the electronic apparatus 100 according to the exemplary embodiment.

As shown in FIG. 7, the first detector 120 of the electronic apparatus 100 receives a voltage value of the battery 110 and converts the voltage value into a digital signal to output a first output value according to a control by the controller 150 (S301). When a detection cycle begins, the controller 150 may control the first detector 120 to detect a voltage of the battery a preset number of times and calculate an average of detected voltages of the battery to determine an average voltage in a low driving current state that the electronic apparatus 100 does not receive a user input or not operate.

The second detector 130 detects a decrease in the voltage of the battery 110 to a preset reference voltage or lower (S302). When the voltage decreases to the preset reference voltage or lower, the second detector 130 may output a low as a second output values to the controller 150. Alternatively, when the voltage decreases to the preset reference voltage or lower, the second detector 130 may output a high as a second output values to the controller 150.

The controller 150 determines a remaining utility the battery based on the output values of S301 and S302, that is, the output values from the first and second detectors 120 and 130 (S303). For example, the remaining utility of the battery may be determined as one of the levels (first to fifth levels) illustrated in FIG. 3, wherein the fifth level corresponds to a level in which the battery needs replacing. When the second detector 130 outputs a low as a result of detection, the controller 150 may determine the remaining utility of the battery as a level lower (one level lower) than a level corresponding to a detection result of the first detector 120. When a decrease of the output value of the second detector 130 from the output value of the first detector 120 is considerable, the controller 150 determines that the remaining utility of the battery is abnormal, that is, as the fifth level in which the battery 110 needs replacing.

The controller 150 displays a UI representing the remaining utility of the battery according to a battery level determined in S303 on the display (S304). Here, the displayed UI may be one of the icons 21 to 25 illustrated in FIG. 3, wherein the icon 25 may be displayed along with a UI indicating a battery warning. When the electronic apparatus 100 does not include the display 140, the battery information may be displayed on the external device 200 connectable through the communicator 160 or be also reported to the user via audio output.

As described above, according to the exemplary embodiments, since normality/abnormality of the battery is determined based on a difference of an output value of the second detector from an output value of the first detector, even a defect in the battery resulting from a temporary high voltage drop that occurs due to an expiration date is detected, leading the user to replace the battery.

Thus, time and costs consumed in unnecessary services due to mistaking a defect in the battery as an error in the apparatus may not be wasted.

Also, accuracy of displaying the remaining utility of the battery is improved using a plurality of detection units to more precisely identify a time to replace the battery, thereby enhancing user's convenience.

Although a few exemplary embodiments have been shown and described, it will be appreciated by those skilled in the art that changes may be made in these exemplary embodiments without departing from the principles and spirit of the invention, the scope of which is defined in the appended claims and their equivalents.

What is claimed is:

1. An electronic apparatus comprising:
   a battery configured to supply power to the electronic apparatus;
   a first detector configured to receive a voltage value of the battery, to convert the voltage value into a signal, and to output the signal;
   a second detector configured to detect whether a voltage value of the battery drops under a predetermined first value; and
   a controller configured;
   to calculate an average voltage from the battery over a predetermined time;

to determine that the battery is in an abnormal state if the average voltage is smaller than a predetermined second value, the second value being larger than the first value;

to determine that the battery is in a normal state if the average voltage is not smaller than the second value and the second detector detects that the voltage value does not drop under the first value in the predetermined time; and to determine that the battery is in the abnormal state if the average voltage is not smaller than the second value and the second detector detects that the voltage value drops under the first value in the predetermined time.

2. The electronic apparatus of claim 1, further comprising a display, wherein the controller is further configured to control the display to display a user interface (UI) representing a determined remaining utility of the battery.

3. The electronic apparatus of claim 2, wherein the controller is further configured to control the display to display a UI representing a battery warning in response to the battery being determined to be in an abnormal state.

4. The electronic apparatus of claim 1, wherein the controller is further configured to determine the remaining utility of the battery as one of a plurality of levels divided according to preset voltage values.

5. The electronic apparatus of claim 4, wherein the controller is further configured to determine the remaining utility of the battery as a lower level than a level corresponding to a signal output by the first detector.

6. The electronic apparatus of claim 1, further comprising a communicator configured to transmit information on the remaining utility of the battery to an external device.

7. The electronic apparatus of claim 1, wherein the first detector comprises an analog-to-digital (A/D) converter configured to convert the voltage value of the battery into a digital value.

8. The electronic apparatus of claim 7, wherein the controller is further configured to measure the voltage of the battery in a low driving electric current of the electronic apparatus, to control the A/D converter to convert the voltage value into a digital value and to output the digital value, and to calculate an average of output values of the A/D converter, and to determine the remaining utility of the battery based on the average of the output values.

9. The electronic apparatus of claim 1, wherein the second detector comprises a plurality of voltage detection blocks having different reference voltages.

10. A method of determining a remaining utility of a battery of an electronic device, the battery being configured to supply power to the electronic device, the method comprising:

converting a voltage value of the battery into a signal with a first detector;

detecting whether a voltage value of the battery drops under a predetermined first value with a second detector;

calculating an average voltage of the battery over a predetermined time;

determining that the battery is in an abnormal state if the average voltage is smaller than a predetermined second value, the second value being larger than the first value;

determining that the battery is in a normal state if the average voltage is not smaller than the second value and the detecting indicates that the voltage value does not drop under the first value in the predetermined time;

determining that the battery is in an abnormal state if the average voltage is not smaller than the second value and the detecting indicates that the voltage value drops under the first value in the predetermine time.

11. The method of claim 10, further comprising displaying a user interface (UI) representing the determined remaining utility of the battery.

12. The method of claim 11, further comprising displaying a UI representing a battery warning in response to the battery being determined to be in an abnormal state.

13. The method of claim 10, wherein the determining of the remaining utility of the battery comprises determining the remaining utility of the battery to be one of a plurality of levels divided according to preset voltage values.

14. The method of claim 13, wherein the determining of the remaining utility of the battery comprises determining the remaining utility of the battery as a lower level than a level corresponding to the signal based on the detecting.

15. The method of claim 10, further comprising transmitting information on the remaining utility of the battery to an external device.

16. The method of claim 10, wherein the converting comprises converting the voltage value of the battery into a digital value and outputting the digital value.

17. The method of claim 16, wherein the converting further comprises outputting a plurality of digital values, and the method further comprises:

calculating an average of the plurality of the digital values.

18. An input apparatus of a display apparatus, the input apparatus comprising:

a communicator configured to communicate with the display apparatus;

a battery configured to supply power to the input apparatus;

a first detector configured to receive a voltage value of the battery, to convert the voltage value into a signal, and to output the signal;

a second detector configured to detect whether a voltage value of the battery drops under a predetermined first value; and a controller configured:

to calculate an average voltage from the battery over a predetermined time;

to determine that the battery is in an abnormal state if the average voltage is smaller than a predetermined second value, the second value being larger than the first value;

to determine that the battery is in a normal state if the average voltage is not smaller than the second value and the second detector detects that the voltage value does not drop under the first value in the predetermined time; and to determine that the battery is in the abnormal state if the average voltage is not smaller than the second value and the second detector detects that the voltage value drops under the first value in the predetermined time.

19. The input apparatus of claim 18, wherein the controller is further configured to control the communicator to transmit information on the remaining utility of the battery to the display apparatus, and wherein the display apparatus is configured to display the remaining utility of the battery based on the transmitted information as one of a plurality of levels divided according to preset voltage values and to display a user interface (UI) representing a battery warning in response to the battery being in an abnormal state.

* * * * *